(12) United States Patent
Maurin-Perrier et al.

(10) Patent No.: US 8,395,091 B2
(45) Date of Patent: Mar. 12, 2013

(54) METHOD FOR FABRICATING A HEATING ELEMENT BY DEPOSITING THIN LAYERS ON AN INSULATING SUBSTRATE AND THE ELEMENT THUS OBTAINED

(75) Inventors: Philippe Maurin-Perrier, St. Marcellin en Forez (FR); Benoit Terme, Firminy (FR); Christophe Heau, Saint Etienne (FR)

(73) Assignee: H.E.F., Andrezieux Boutheon (FR)

( * ) Notice: Subject to any disclaimer, the term of this patent is extended or adjusted under 35 U.S.C. 154(b) by 249 days.

(21) Appl. No.: 12/865,771

(22) PCT Filed: Jan. 26, 2009

(86) PCT No.: PCT/FR2009/050111
§ 371 (c)(1),
(2), (4) Date: Aug. 2, 2010

(87) PCT Pub. No.: WO2009/098421
PCT Pub. Date: Aug. 13, 2009

(65) Prior Publication Data
US 2010/0308030 A1  Dec. 9, 2010

(30) Foreign Application Priority Data

Feb. 6, 2008 (FR) .................................. 08 50747

(51) Int. Cl.
*H05B 3/00* (2006.01)
(52) U.S. Cl. .............. 219/260; 219/543; 219/520
(58) Field of Classification Search .................. 219/260, 219/543, 520
See application file for complete search history.

(56) References Cited

U.S. PATENT DOCUMENTS

| | | | |
|---|---|---|---|
| 2,111,742 A | | 3/1938 | Bloomenthal |
| 2,419,537 A | | 4/1947 | Christensen |
| 2,624,823 A | * | 1/1953 | Lytle .............................. 428/189 |
| 3,095,340 A | | 6/1963 | Triller |
| 3,458,847 A | | 7/1969 | Waits |
| 3,594,225 A | | 7/1971 | Waits |
| 3,772,075 A | | 11/1973 | Tarnopol et al. |
| 4,725,710 A | * | 2/1988 | Ramus et al. .................. 219/203 |
| 4,911,353 A | * | 3/1990 | Deakin ......................... 228/183 |
| 5,099,104 A | * | 3/1992 | Holzer et al. ................. 219/203 |
| 5,332,888 A | * | 7/1994 | Tausch et al. ................. 219/547 |
| 5,643,483 A | * | 7/1997 | Kubota et al. ................. 219/543 |
| 6,222,166 B1 | * | 4/2001 | Lin et al. ....................... 219/538 |

(Continued)

FOREIGN PATENT DOCUMENTS

FR  2927218 A1 * 8/2009
GB  499816 A  1/1939

(Continued)

OTHER PUBLICATIONS

International Search Report for PCT/FR2009/050111, dated Jul. 29, 2009.

*Primary Examiner* — Laura Menz
(74) *Attorney, Agent, or Firm* — Heslin Rothenberg Farley & Mesiti P.C.

(57) ABSTRACT

A method for fabricating a heating a element includes modifying the surface state of a substrate in order to obtain at least one smooth area of low roughness and at least one rough area having a higher roughness; applying a highly electrically conductive material to these various areas; and connecting smooth area(s) of the conductive material to an electrical power source.

11 Claims, 2 Drawing Sheets

U.S. PATENT DOCUMENTS

| | | | |
|---|---|---|---|
| 6,262,401 B1 * | 7/2001 | Knoeppel et al. | 219/543 |
| 6,433,319 B1 * | 8/2002 | Bullock et al. | 219/543 |
| 6,580,061 B2 * | 6/2003 | Black | 219/543 |
| 6,663,914 B2 * | 12/2003 | Black | 427/8 |
| 6,674,053 B2 * | 1/2004 | Bullock et al. | 219/541 |
| 6,762,396 B2 * | 7/2004 | Abbott et al. | 219/543 |
| 6,835,916 B2 * | 12/2004 | Ito et al. | 219/444.1 |
| 6,861,620 B2 * | 3/2005 | Ito et al. | 219/444.1 |
| 6,878,906 B2 * | 4/2005 | Ito et al. | 219/444.1 |
| 6,887,316 B2 * | 5/2005 | Hiramatsu et al. | 118/725 |
| 6,917,020 B2 * | 7/2005 | Ito | 219/520 |
| 6,924,464 B2 * | 8/2005 | Zhou et al. | 219/444.1 |
| 6,967,313 B1 * | 11/2005 | Furukawa et al. | 219/465.1 |
| 6,985,000 B2 * | 1/2006 | Feder et al. | 324/750.05 |
| 7,081,602 B1 * | 7/2006 | Black | 219/523 |
| 8,071,916 B2 * | 12/2011 | Iwata et al. | 219/385 |
| 2006/0163563 A1 | 7/2006 | Ulmer et al. | |
| 2006/0250078 A1 * | 11/2006 | Lee et al. | 313/506 |
| 2007/0220745 A1 | 9/2007 | Busch et al. | |
| 2009/0021161 A1 * | 1/2009 | Lee et al. | 313/506 |
| 2010/0078321 A1 * | 4/2010 | Martin et al. | 204/298.12 |
| 2010/0095923 A1 * | 4/2010 | Maurin-Perrier et al. | 123/196 R |
| 2010/0308030 A1 * | 12/2010 | Maurin-Perrier et al. | 219/260 |

FOREIGN PATENT DOCUMENTS

| | | |
|---|---|---|
| GB | 2128813 A | 5/1984 |
| JP | 7226301 A | 8/1995 |
| JP | 8124707 A | 5/1996 |
| WO | WO 0158213 A1 | 8/2001 |
| WO | WO 03095251 A2 | 11/2003 |
| WO | WO 2005107348 A | 11/2005 |
| WO | WO 2008047044 A2 * | 4/2008 |

* cited by examiner

METHOD FOR FABRICATING A HEATING ELEMENT BY DEPOSITING THIN LAYERS ON AN INSULATING SUBSTRATE AND THE ELEMENT THUS OBTAINED

CROSS REFERENCE TO RELATED APPLICATIONS

This application is a national stage filing under section 371 of International Application No. PCT/FR2009/050111, filed on Jan. 26, 2009, and published in French on Aug. 13, 2009, as WO 2009/098421 and claims priority of French application No. 0850747 filed on Feb. 6, 2008, the entire disclosure of these applications being hereby incorporated herein by reference.

TECHNICAL FIELD

The invention relates to the technical field of depositing thin layers in order to produce heating elements on an insulating substrate.

The invention has advantageous applications in the field of demisting or de-icing surfaces, such as reflecting surfaces in the automotive industry or the leading edges of aircraft wings in the aeronautical industry.

BACKGROUND ART

As known to those skilled in the art, a heating element consists of an area characterised by a low electrical resistance referred to as the "cold zone" and by an area having a much higher electrical resistance that constitutes the actual heating part.

In one heating element design, two cold zones are associated with the hot zone by being connected in series so that the intensity of the electrical current that flows through each of the zones is identical.

The function of the cold zones is to connect the current supply obtained from an external source and to distribute the current uniformly to the terminals of the heating part.

The reader is reminded that power equals resistance times current squared and that the flow of current produces a significant temperature rise in the area which has a higher electrical resistance and is referred to as the hot zone. Conversely, given the fact that the cold zones have the lowest possible electrical resistance, minimal thermal power is released from the electrical connections.

Also, because resistance equals resistivity times the length of the conductor divided by its cross-sectional area, it is possible to modify resistance values by varying any of the above-mentioned parameters Resistivity, length, cross-sectional area.

In one embodiment of thin-layer heating elements using, for example, a vacuum deposition technique, one can employ at least two materials of different resistivity, each of them being deposited through specific masks in order to successively constitute a (hot zone) heating part in the form of a track and one or more collectors or drains. The two materials are selected depending on their intrinsic resistivity, whereas their cross-sectional areas are determined depending on the conductance values required for the cold zones and the resistance value required for the heating part.

If the heating coating does not make it possible to obtain a sufficiently high electrical resistance by adjusting the thickness of said coating, it becomes necessary to alter the length of the resistance deposited in the form of tracks in order to consequently increase the distance over which the current flows.

As stated above, a second highly conductive material is deposited at the ends of the resistances in order to act as a drain. One can cite, for example, the disclosures in Patents JP7226301 and JP8124707.

In another embodiment, if the deposited resistance is not in the form of a track, electrical connections can be made either side of the resistive coating through a conductive coating produced in the form of strips known as drains. Such a solution is disclosed in Documents WO0158213, WO03095251 and U.S. Pat. No. 4,543,466. As disclosed in Document WO0158213, the heating layer is made of a transparent conductive material and it is associated with a highly conductive layer of silver in order to fulfil the drain function without any temperature rise.

As a result of this state of the art, producing a heating element by depositing thin layers involves two stages:
 a first stage to deposit the electrical resistance through a mask in the case of a resistance in the form of tracks or to deposit it directly onto the entire surface of the substrate. Note that tracks may also be fabricated by selectively removing the resistive deposit;
 a second stage to deposit another coating through another mask to produce drains.

It is therefore necessary to use two different materials and to manipulate a mask between the two deposition processes.

This state of the art is illustrated schematically in FIG. 1 which shows a heating element produced in two stages. The heating element consists of a substrate (C) made of an electrically insulating material such as a ceramic, glass or plastic etc. A slightly conductive coating (B) is deposited over the entire surface of substrate (C). A mask is positioned on coating (B) in such a way that, for example, it does not cover its ends so as to make it possible to deposit a second highly conductive coating in order to produce drains (A) for connecting an electrical power source such as a generator (G).

DISCLOSURE OF THE INVENTION

Starting from this state of the art, the problem which the invention aims to solve is to produce thin-film heating elements in a single deposition process using a single material.

To solve such a problem, a method for fabricating a heating element by depositing thin layers on an insulating substrate has been conceived and perfected whereby:
 One modifies the surface state of the substrate in order to obtain at least one smooth area of low surface roughness Ra and at least one area having a higher surface roughness Rax;
 One applies a highly electrically conductive material to these various areas;
 One connects the smooth area(s) to an electrical power source.

As a result of this method, the heating element can be produced in a single deposition process in order to simultaneously produce the electrical resistance and drains which, in this case, consist of areas of low roughness.

There is therefore no longer any need to use two different materials or to apply different masks during the process of producing the coatings.

Counter-intuitively for those skilled in the art, according to the invention, the highly conductive material is used for the heating part, not just for the cold parts or drains.

Starting with this basic design:

- One deposits the layer of highly conductive material over the entire substrate so as to cover all the smooth and rough areas, or
- One deposits the layer of highly conductive material so as to form a track which covers part of the smooth areas and part of the rough area.

In one embodiment, one produces a raised rough area between two smooth areas.

The invention also relates to a heating element obtained by depositing thin layers on an insulating substrate which has at least one heating part that uses the joule effect and at least one electrical connection part consisting of at least one raised rough area Rax and at least one smooth area of low roughness Ra, said areas being covered by a thin layer of a highly conductive material and an electrical power source being connected to the smooth area(s).

Highly conductive materials that are capable of being used include, merely by way of information and not limitatively, aluminium, copper, silver, gold and, more generally speaking, any material that has an intrinsic electrical conductivity in excess of $30 \times 10^6$ S·m$^{-1}$ at ambient temperature.

According to another aspect, the roughness Ra of the smooth area(s) is less than 0.5 µm.

In one embodiment, the substrate has a smooth area of low roughness Ra located alongside an area of higher roughness Rax.

In another embodiment, the substrate has two smooth areas of low roughness Ra located either side of an area of higher roughness Rax.

It is apparent from this method that:

- The thin layer of highly conductive material is deposited over the entire surface of the substrate so as to cover the various areas, or
- The thin layer of highly conductive material is deposited in the form of a track that covers the various areas.

Particularly advantageous results have been achieved when the electrical resistance ratio R2/R1 exceeds the ratio of the square of the coefficients α1 and α2, i.e. $R2/R1 > (\alpha 2)^2/(\alpha 1)^2$, where:

R1=resistance in ohms of the smooth area of low roughness (Ra);
R2=resistance in ohms of the area of higher roughness (Rax);
α1=developed length of the smooth area divided by its length as scanned by using a profilometer;
α2=developed length of the area of higher roughness divided by its length as scanned by using a profilometer.

BRIEF DESCRIPTION OF THE DRAWING FIGURES

The invention is explained below in greater detail, reference being made to the accompanying drawings in which.

DETAILED DESCRIPTION

Figure 3:
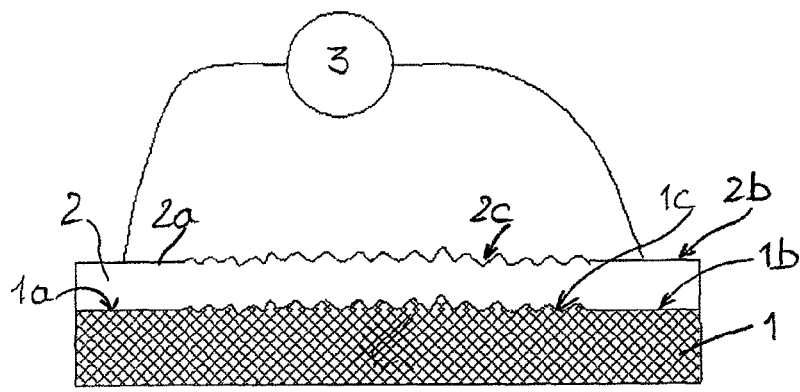
FIG. 3 is a schematic cross-sectional view similar to FIG. 1, showing the heating element obtained according to the invention.
Figure 4:
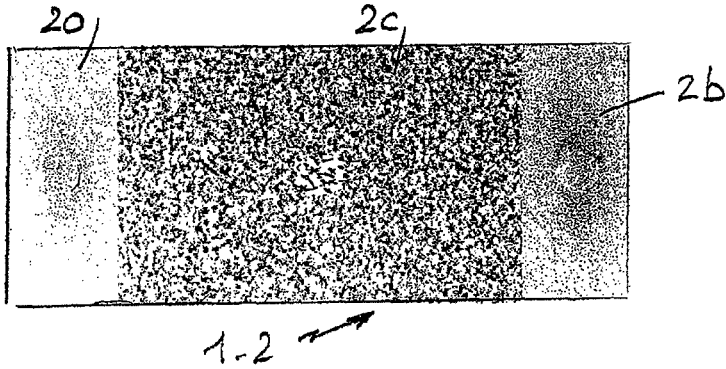
FIG. 4 is a top view equivalent to FIG. 3.

FIGS. 3 and 4 show a first embodiment of heating elements obtained according to aspects of the invention on an electrically insulating substrate (1) of any known appropriate type.

According to one basic aspect of the invention, the surface state of substrate (1) is modified so as to obtain smooth areas (1a) and (1b) of low roughness Ra, typically less than 0.5 µm, and an area (1c) of higher roughness Rax which necessarily exceeds 0.5 µm.

A coating (2) consisting of a highly electrically conductive material is deposited over the entire surface area of substrate (1) on the same side as areas (1a), (1b) and (1c). The conductivity of the highly conductive material exceeds $30 \ 10^6$ S/m$^2$ at ambient temperature. Thus, areas (2a) and (2b), above smooth areas (1a) and (1b) of substrate (1), constitute drains for connecting an electrical power source such as generator (3), whereas area (2c) above area (1c) which has a higher roughness constitutes the heating part of the element.

The electrical resistance is trimmed mainly by modifying the surface roughness of area (1c) of the substrate. It is also possible to combine the roughness characteristics and to modify the thickness of the coating in order to trim the resistance value.

Coating (2) can be deposited in the form of tracks, for instance, by placing a mask before depositing said coating or by selectively removing the coating.

To produce tracks, it has been established that it is important to give preference to surfaces of low roughness in the vicinity of the bend radii of tracks because a surface of low roughness encourages a low resistance which makes it possible to reduce temperature rises and, consequently, avoid damaging the deposit.

Figure 5:
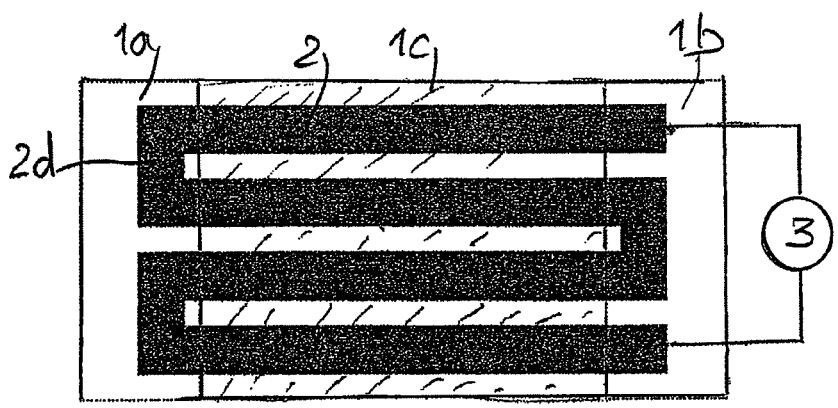
Figure 8:
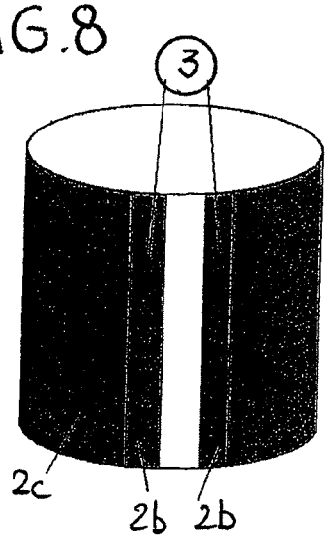
FIG. 8 is a view equivalent to FIG. 7 after a coating has been deposited on the outside of the cylindrical area.

One advantageous embodiment is illustrated in FIG. 5 which shows a substrate (1) that has a raised central area of higher roughness Rax (1c) and two lateral areas (1a) and (1b) of low roughness (Ra). Area (1a) where the bend radii (2d) of tracks (2) of low roughness are located makes it possible to avoid overheating, in the same way as in the vicinity of the drains for electrically connecting generator (3).

Figure 6:
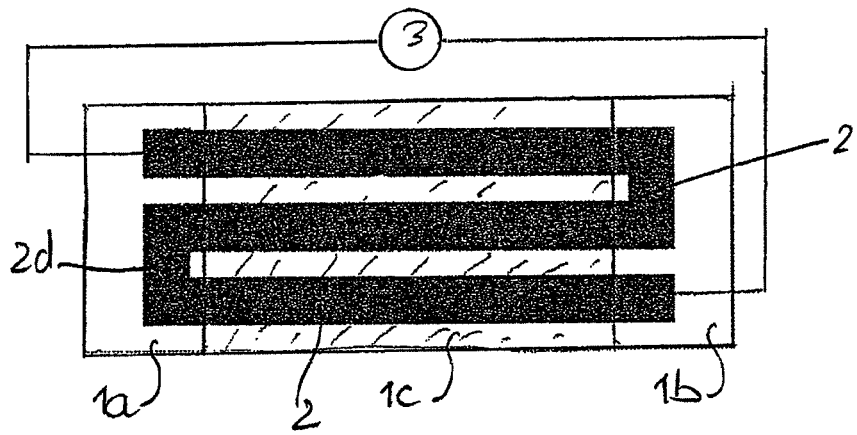
FIGS. 5 and 6 are schematic top views of other embodiments of the heating element in which the highly conductive coating is deposited in the form of a track.

In the Figures shown, the substrate has two smooth areas (1a) and (1b) of low roughness Ra located either side of an area of higher roughness Rax. The substrate may possibly have a single smooth area of low roughness Ra located alongside an area of higher roughness Rax. Similarly, tracks (2d)

consisting of highly electrically conductive coating (2) may be produced with different shapes. See FIGS. 5 and 6.

Figure 7:
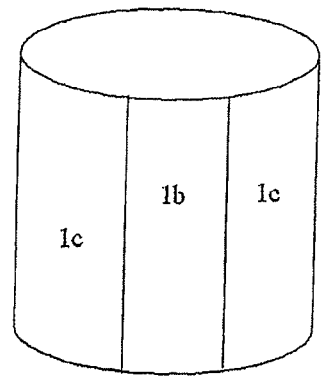
FIG. 7 is a schematic perspective view of an element with a smooth area and a rough area.

In FIG. 7, the substrate has an area of low roughness (1b) and an area of high roughness (1c). Coating (2) is deposited on the outside of the cylindrical surface in area (2c) (area of high roughness) and in area (2b) (area of low roughness) where electrical generator (3) is connected.

Firstly, it is necessary to emphasise the advantage that, according to the invention, local modification of the surface state of the substrate before depositing the conductive coating makes it possible to produce heating elements using a single material, regardless whether or not the elements are in the form of a track.

and 24 mm wide respectively. The roughness profiles were used to calculate the developed length for each surface state.

The electrical resistances were characterised by applying an electric current and measuring the voltage across the terminals of the resistance. All the substrates were coated simultaneously in the vacuum deposition equipment. The substrates were also positioned identically relative to the deposition source.

On specimen glass substrates having a roughness Ra less than 0.01 µm, the measured thickness of the deposited copper was 1.15 µm.

The rough test pieces were prepared in accordance with the principle shown in FIGS. 3 and 4.

| Resistance width | Ra (µm) | I (A) | U (V) | R = U/I (Ohm) | R2/R1 | Measured $\alpha$ | $\alpha \times \alpha$ | $(\alpha 2 \times \alpha 2)/(\alpha 1 \times \alpha 1)$ |
|---|---|---|---|---|---|---|---|---|
| 24 mm | 0.02 | 3 | 1.162 | R1 = 0.387 | 3.2 | $\alpha 1$ = 1.0004 | 1.0008 | 1.2 |
|  | 4.86 | 1 | 1.245 | R2 = 1.245 |  | $\alpha 2$ = 1.0841 | 1.1752 |  |
| 12 mm | 0.02 | 2 | 1.489 | R1 = 0.745 | 3.2 | $\alpha 1$ = 1.0004 | 1.0008 | 1.2 |
|  | 4.86 | 1 | 2.400 | R2 = 2.400 |  | $\alpha 2$ = 1.0841 | 1.1752 |  |
| 5 mm | 0.02 | 1 | 1.705 | R1 = 1.705 | 3.1 | $\alpha 1$ = 1.0004 | 1.0008 | 1.2 |
|  | 4.86 | 1 | 5.225 | R2 = 5.225 |  | $\alpha 2$ = 1.0841 | 1.1752 |  |

$\alpha$ is the developed length divided by the length scanned using a profilometer. In the Table, rough surfaces are denoted by 1 and smooth surfaces are denoted by 2.
$\alpha$ = developed dimension/apparent dimension This surface-state modification can be produced upstream when the substrate is fabricated, in the case of a polymer substrate, for instance, by means of a raised area on the surface of an injection moulding die.

This surface-state modification can also be obtained directly on the substrate before deposition by using a technique known as sandblasting or any other suitable means of modifying the roughness of the substrate in question.

In the case of substrates that are electrically conductive, a first insulating coating can be applied before depositing the heating element.

Note that, in order to produce the basic characteristics of the heating element according to the invention, one can either:
 Use a substrate of low roughness Ra which is treated to obtain, for example, an area of higher roughness Rax between two smooth areas of roughness Ra, or
 Use a substrate of higher roughness Rax which is treated to obtain, for example, two areas of low roughness Ra either side of an area of higher roughness Rax.
See the three examples below:

Example 1

In example 1, copper was deposited on polycarbonate substrates using the vacuum deposition technique.

Polycarbonate substrates, in strip form, have an initial surface roughness value Ra=0.02 µm. These polycarbonate substrates were subjected to sandblasting before vacuum deposition and this increased their roughness to Ra=4.9 µm.

The ends of the strips were kept smooth in order to fulfil an electrical bonding function and to distribute current uniformly.

Three types of resistances were produced on each surface state. The length of the resistances is 98 mm and they are 5, 12

It is obvious that roughness has the effect of increasing the length and the developed width of a surface.

The value of electrical resistance $R_i$ is generally expressed as follows:

$$R_i = \rho \times L \times \alpha_i / ((e/(\alpha_i \times \alpha_i)) \times l \times \alpha_i) = \rho \times L \times \alpha_i \times \alpha_i / (e \times l)$$

The developed length ($L_i$) of surface i is $L \times \alpha_i$, the width ($l_i$) of surface i is $l \times \alpha_i$ and the thickness ($e_i$) of the deposit on surface i becomes $e/(\alpha_i \times \alpha_i)$, such that the deposited volume (V) remains unchanged. $V = V_i = L \times \alpha_i \times l \times \alpha_i \times e/(\alpha_i \times \alpha_i) = L \times l \times e$ This leads us to conclude that the ratio of the electrical resistances (R2/R1) should equal, for those skilled in the art, the ratio of the square of coefficients $\alpha$ (R2/R1=$(\alpha 2 \times \alpha 2)/(\alpha 1 \times \alpha 1)$).

The experimental results demonstrate that, for the 3 electrical resistance widths, the rough areas give an increase in electrical resistance in the ratio R2/R1 from 3.1 to 3.2.

An increase by a factor such as this makes it possible to use highly conductive materials as an electrical resistance and, in the smooth areas, the deposits behave like a short-circuit and cannot be used as heating elements.

The results also demonstrate that the increase in electrical resistance is not primarily due to the geometrical effects of surface roughness because, surprisingly, ratio R2/R1 far exceeds the ratio of the squares of coefficients $\alpha$. Moreover, if adopting a theoretical approach, the idea of altering the surface roughness would not be immediately obvious to those skilled in the art because an increase in electrical resistance by a factor of only 1.2 does not make it possible to turn a short-circuit into a heating resistance.

Example 2

In example 2, the same materials as in example 1 were deposited on polysulphone using the vacuum deposition technique. The rough test pieces were prepared in accordance with the principle shown in FIGS. 3, 4 and 5. The length of the resistances is 45 mm and they are 12 and 23 mm wide respectively.

| Substrate | Resistance width | Ra (μm) | R = U/I (Ohm) | R2/R1 | Measured α | α × α | (α2 × α2)/(α1 × α1) |
|---|---|---|---|---|---|---|---|
| Polysulphone | 23 mm | 0.08 | R1 = 0.293 | 4.9 | α1 = 1.0008 | 1.0016 | 1.2 |
|  |  | 6.04 | R2 = 1.430 |  | α2 = 1.1001 | 1.2102 |  |
|  | 12 mm | 0.08 | R1 = 0.441 | 5.5 | α1 = 1.0008 | 1.0016 | 1.2 |
|  |  | 6.04 | R2 = 2.450 |  | α2 = 1.1001 | 1.2102 |  |

In this example, it is also apparent that the increase in electrical resistance does not match the geometrical effects of surface roughness. The change in developed length does not explain the increase in resistance.

Example 3

Heating resistances were produced on polycarbonate pieces in this example. A mask was placed on the test pieces before deposition in order to obtain tracks.

Four parts (heating element) were produced by way of comparison.

On part 1, the surface state of the substrate was not modified and Ra is approximately 0.02 μm.

On part 2, the surface state of the entire substrate was modified and Ra is approximately 4.92 μm.

On part 3, the surface state of the substrate was not modified in the vicinity of the bends and near the electrical contacts and in these areas Ra is approximately 0.02 μm.

In the vicinity of the tracks, roughness was increased by sandblasting to increase the roughness from 0.02 μm to 4.89 μm. Piece 3 was produced in accordance with the principle shown in FIGS. 3, 4 and 5.

Copper was deposited on these first three pieces by using PVD. The thickness of this deposit was measured in the smooth areas where Ra=0.02 μm and is 0.5 μm.

Figure 1:
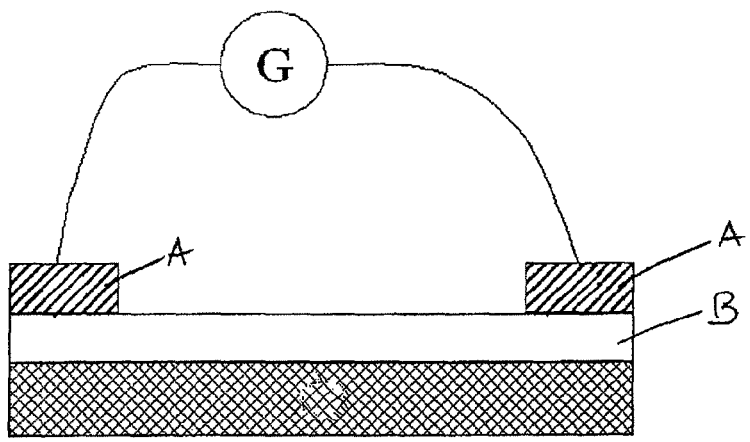
FIG. 1 is a schematic view of a heating element according to the prior state of the art.
Figure 2:
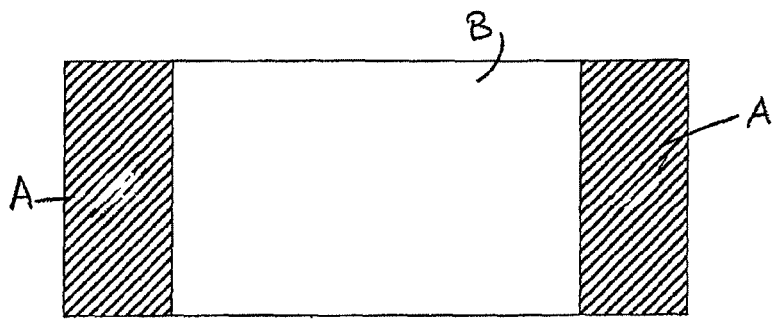
FIG. 2 is a top view equivalent to FIG. 1.

On piece 4, made according to the principle of the state of the art (FIGS. 1 and 2), the surface of the part has a roughness of 0.02 μm. A first 0.1 μm layer of resistive NiCr alloy was deposited through a first mask. After this first deposit, a second mask was placed on the part and a 0.5 μm copper layer was then deposited on the end areas as defined in FIG. 5.

Having determined the overall electrical resistance, 12 V was then applied to the resistances in order to measure the temperature rise due to the joule effect. The ambient temperature during the temperature-rise measurements was 20° C.

| Part | R overall | T equilibrium in ° C. | Observation |
|---|---|---|---|
| 1 | 3.2 ohm | N D | Non-compliant: substrate damaged by overheating. |
| 2 | 11.2 ohm | N D | Non-compliant: electrical contacts damaged |
| 3 | 10.0 ohm | 65° C. | Compliant |
| 4 | 10.3 ohm | 63° C. | Non-compliant: 2 materials in 2 stages |

Results:

Part 1 is non-compliant—the excessively smooth surface state results in very low resistance so that, when 12 V is applied to the resistance, the excessive rise in temperature caused by the high amperage damages the substrate by raising its temperature above 150° C. which is its glass transition temperature.

Part 2 is non-compliant—the rise in temperature in the vicinity of the electrical contacts where the streamlines are very tightly packed damages the deposit and the substrate in the vicinity of these contacts.

Part 3 is compliant—its resistance value limits the flow of current so that the temperature rises to a value that is compatible with applications such as de-icing or demisting without damaging the medium. Near the electrical contacts and bends of the track structure where the current density is high, the smooth surfaces provide low resistance which avoids local overheating.

Finally, part 4 is non-compliant despite the fact that it can be used as a heating element. In fact, the structure was obtained by using 2 materials having very different conductivities and by performing deposition in 2 stages and using a mask between these 2 stages—this corresponds to the state of the art with its resulting drawbacks which the invention aims to eliminate.

The advantages are readily apparent from the description. The ability to obtain a heating element in a single fabrication stage using a single material to produce both electrical resistance and drains is emphasised and highlighted in particular.

The invention claimed is:

1. Heating element obtained by depositing thin layers on an insulating substrate having at least one electrically heating part and at least one electrical connection part, said insulating substrate comprising at least one smooth area of low roughness and at least one rough area of higher roughness, said at least one smooth area and said at least one rough area being covered in a thin layer of a highly conductive material deposited upon said at least one smooth area and said at least rough area, and an electrical power source being connected at and to smooth area(s) of said layer overlying said at least one smooth area of the insulating substrate.

2. Element as claimed in claim 1, wherein the roughness of the at least one smooth area is less than 0.5 μm.

3. Element as claimed in claim 1, wherein the substrate has a smooth area of low roughness deposited alongside an area of higher roughness.

4. Element as claimed in claim 1, wherein the substrate has two smooth areas of low roughness deposited either side of an area of higher roughness.

5. Element as claimed in claim 1, wherein the thin layer of highly conductive material is deposited over an entire surface of the substrate so as to cover the at least one smooth area and the at least one rough area.

6. Element as claimed in claim 1, wherein the thin layer of highly conductive material is deposited in the form of a track which covers the at least on smooth area and the at least one rough area.

7. Element as claimed in claim 1, wherein the conductivity of the highly conductive material exceeds 30 $10^6$ S/m$^2$ at ambient temperature.

8. Element as claimed in claim 1, wherein the highly conductive material comprises copper, aluminium, silver or gold.

9. Element as claimed in claim 1, wherein the substrate comprises an insulating material.

10. Element as claimed in claim 1, wherein the substrate comprises a conductive material covered with an insulating layer.

11. Element as claimed in claim 1, wherein a ratio of electrical resistances R2/R1 exceeds the ratio of the square of coefficients $\alpha 1$ and $\alpha 2$, i.e. $R2/R1 > (\alpha 2)^2/(\alpha 1)^2$, where:
- R1=resistance in ohms of the smooth area of low roughness;
- R2=resistance in ohms of the rough area of higher roughness;
- $\alpha 1$=developed length of the smooth area divided by its length as scanned by using a profilometer;
- $\alpha 2$=developed length of the rough area of higher roughness divided by its length as scanned by using a profilometer.

* * * * *